(12) United States Patent
Chu

(10) Patent No.: US 6,444,574 B1
(45) Date of Patent: Sep. 3, 2002

(54) METHOD FOR FORMING STEPPED CONTACT HOLE FOR SEMICONDUCTOR DEVICES

(75) Inventor: Chien-Lung Chu, Hsinchu (TW)

(73) Assignee: Powerchip Semiconductor Corp., Hsin-chu (TW)

( * ) Notice: Subject to any disclaimer, the term of this patent is extended or adjusted under 35 U.S.C. 154(b) by 0 days.

(21) Appl. No.: 09/948,485

(22) Filed: Sep. 6, 2001

(51) Int. Cl.[7] .......................................... H01L 21/4763
(52) U.S. Cl. ...................... 438/638; 438/640; 438/701; 438/713
(58) Field of Search .............................. 438/637, 638, 438/640, 701, 713

(56) References Cited

U.S. PATENT DOCUMENTS

| | | | |
|---|---|---|---|
| 6,028,001 A | * 2/2000 | Shin | 438/640 |
| 6,077,769 A | * 6/2000 | Huang et al. | 438/622 |
| 6,177,347 B1 | * 1/2001 | Liu et al. | 438/675 |
| 6,265,307 B1 | * 7/2001 | Lou et al. | 438/633 |
| 6,284,657 B1 | * 9/2001 | Chooi et al. | 438/687 |
| 6,313,030 B1 | * 11/2001 | Kikuta | 438/640 |
| 6,323,118 B1 | * 11/2001 | Shih et al. | 438/624 |
| 6,326,300 B1 | * 12/2001 | Liu et al. | 438/638 |
| 6,331,479 B1 | * 12/2001 | Li et al. | 438/618 |
| 6,352,921 B1 | * 3/2002 | Han et al. | 438/638 |

\* cited by examiner

*Primary Examiner*—Olik Chaudhuri
*Assistant Examiner*—David S Blum
(74) *Attorney, Agent, or Firm*—Ladas & Parry

(57) ABSTRACT

A method for forming a contact hole having a stepped sidewall is disclosed. First, a capping layer is formed on a semiconductor substrate, and then, a first dielectric layer and a second dielectric layer having different etch rates are formed on the capping layer. A preliminary contact hole is anisotropically etched through the layers, and part of the way through the substrate. After this, the sidewalls of the preliminary contact hole are isotropically etched with an etching agent having a higher etch rate for the second dielectric layer than for the first dielectric layer, thereby forming a step sidewall. Finally, the exposed portions of the capping layer are removed to complete the contact hole fabrication.

12 Claims, 3 Drawing Sheets

METHOD FOR FORMING STEPPED CONTACT HOLE FOR SEMICONDUCTOR DEVICES

BACKGROUND OF THE INVENTION

1. Field of the Invention

The present invention relates in general to semiconductor technology. More particularly, it relates to a contact hole forming method for a semiconductor device.

2. Description of the Related Arts

One important technique for fabricating a semiconductor device involves forming a connection between an upper level wiring layer and either a conductive region of an impurity-diffused layer in a semiconductor substrate or a lower level wiring layer. Such a connection is preferably formed through a contact hole formed in interlayer insulating film.

As the density of integrated circuits has increased, the design rule, i.e., the minimum feature size, has decreased. With this increasing scale of integration of semiconductor devices, the diameters of contact holes are accordingly being made even smaller; however, it is difficult to reduce the depths of contact holes because of the need for wiring resistance or capacity. For this reason, the aspect ratios of contact holes have rapidly increased in recent years, and there has been a high demand for forming metal electrodes featuring good coverage.

FIGS. 1A to 1C are cross-sections at selected stages of a conventional fabrication process for forming a contact hole and a barrier metal film. Referring to FIG. 1A, on a semiconductor substrate 10, an interlayer dielectric (ILD) layer 14 is provided with a capping layer 12 interposed. The ILD layer 14 generally consists of one or more dielectric depositions of spin on glass (SOG), silicon oxide, borophosphosilicate (BPSG), and so on. The capping layer 12, serving as a diffusion barrier to prevent diffusion of impurities in the ILD layer 14 into the substrate 10, is typically silicon nitride (SiN), though other materials may be used.

Next, as illustrated in FIG. 1B, a contact hole 16 is etched through the ILD layer 14 and the capping layer 12 using a photoresist pattern as a mask. The etching is further carried into the substrate 10 to a predetermined depth to form a recess portion 16a below the substrate surface. Here, because the silicon nitride capping layer 12 is less liable to be etched as compared with the substrate 10 and the ILD layer 14, an overhang configuration H is created within the contact hole 16 above the recess portion 16a.

Thereafter, a conventional method of forming a contact is by sputtering a Ti/TiN barrier layer 18 over the ILD layer 14 and over bottom and sidewalls of the contact hole 16. However, as illustrated in FIG. 1C, the overhang H makes sputtering of the barrier layer very difficult. The step coverage of the Ti/TiN layer 18 is especially poor on sidewalls of the recess portion 16a. The insufficient coverage of Ti/TiN barrier 18 leads to high contact resistance and yield problems, and stable electrical characteristics of a contact electrode cannot be obtained. An improved method for forming a contact hole is thus desirable.

SUMMARY OF THE INVENTION

Therefore, an object of the invention to provide a method for forming a stepped contact hole that substantially obviates the above-mentioned problems.

To achieve the above and other objects, a method for forming a stepped contact hole is provided comprising the steps of: forming a capping layer on a substrate; sequentially forming a first dielectric layer and a second dielectric layer having different etch rates on the capping layer; etching a preliminary contact hole through the second dielectric layer, the first dielectric layer, the capping layer, and part of the way through the substrate; isotropically etching the sidewalls of the preliminary contact hole with an etching agent having a higher etch rate for the second dielectric layer than for the first dielectric layer, thereby forming a contact hole having a stepped sidewall; and anisotropically etching to remove exposed portions of the capping layer.

In a preferred embodiment of the invention, the second dielectric layer is TEOS oxide, the first dielectric layer is BP-TEOS oxide, and the isotropic etching is carried out using a buffered HF solution.

BRIEF DESCRIPTION OF THE DRAWINGS

The above and other objects, features, and advantages of the present invention will become apparent from the following detailed description of preferred embodiments of the invention explained with reference to the accompanying drawings, in which.

DESCRIPTION OF THE PREFERRED EMBODIMENTS

Figure 1A:
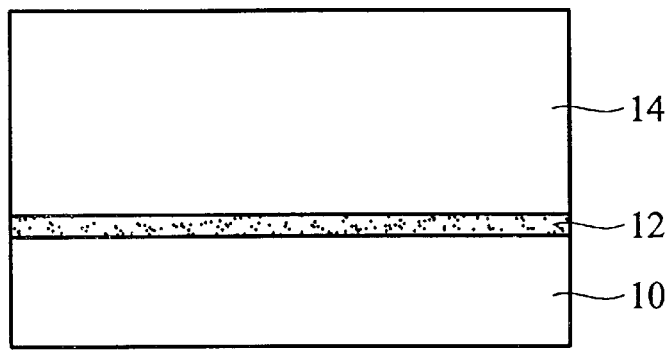
FIGS. 1A to 1C are cross-sections illustrating the steps of a conventional method for forming a contact hole and a barrier metal layer.
Figure 1B:
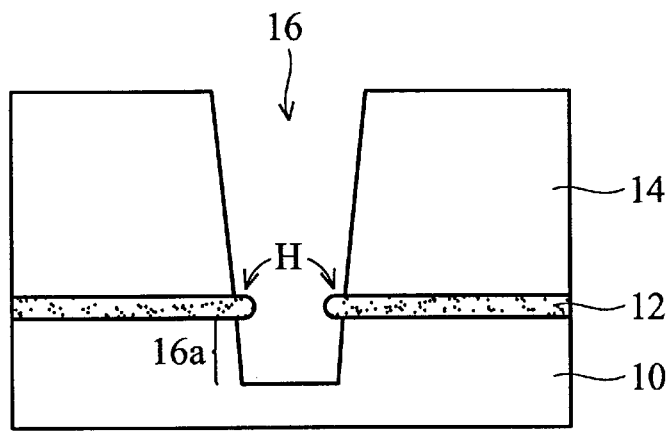
Figure 1C:
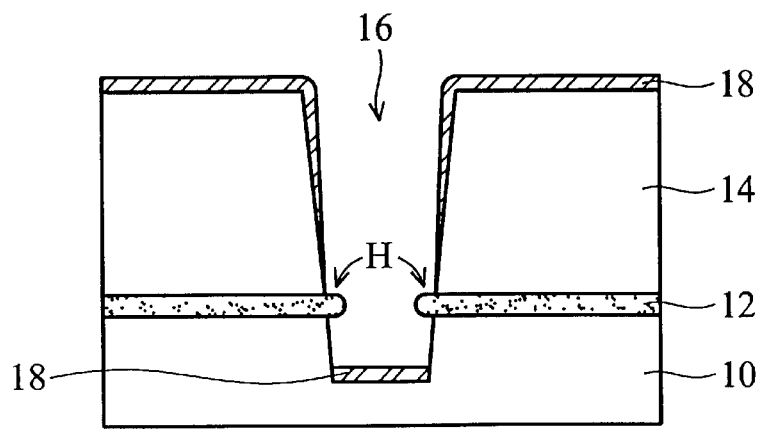
Figure 2A:
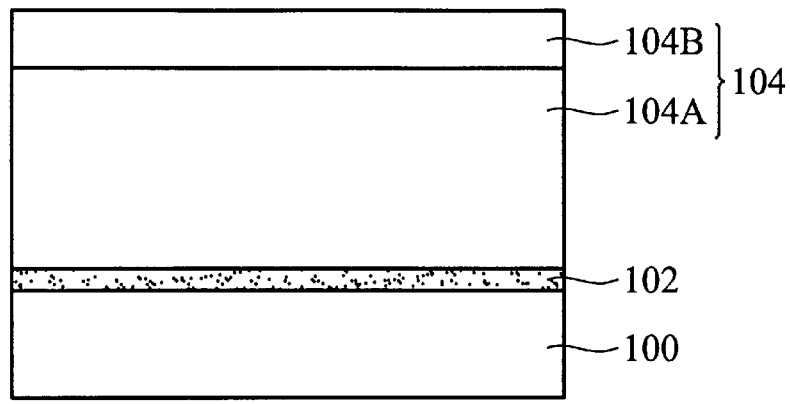
FIGS. 2A to 2D are cross-sections illustrating the steps for forming a stepped contact hole according to a preferred embodiment of the invention.

The present invention will be described in detail with reference to the accompanying drawings. As shown in FIG. 2A, the method begins by providing a semiconductor substrate 100 such as a silicon substrate. The substrate 100 is understood to possibly include a semiconductor wafer, active and passive semiconductor devices/elements formed within the wafer and layers formed on the wafer surface. In the context of this document, the term "substrate" is mean to include devices formed within a semiconductor wafer and the layers overlying the wafer.

First, the substrate surface is capped with a capping layer 102 of silicon nitride with a thickness between about 150 and 200 Å. The capping layer 102 serves as a diffusion barrier to prevent diffusion of impurities into the substrate 100. The silicon nitride layer 102 can be formed by reacting dichlorosilane ($SiCl_2H_2$) with ammonia ($NH_3$) through a low pressure chemical vapor deposition (LPCVD) process. The silicon nitride capping layer 102 can be replaced by other materials suitable for serving as a diffusion barrier, such as silicon oxynitride (SiON).

Next, a ILD layer 104 consisting of a first dielectric layer 104A and a second dielectric layer 104B having different etch rates is formed over the capping layer 102. As will become apparent, this invention requires that the second (upper) dielectric layer 104B has a faster etch rate with respect to the first (lower) dielectric layer 104A to create a desirable stepped profile. Preferably, the second dielectric layer 104B is composed of undoped oxide and the first dielectric layer 104A is composed of doped oxide. More preferably, the second dielectric layer 104B is composed of TEOS oxide (oxide deposited from a gas flow containing tetraethylorthosilane (TEOS)) and the first dielectric layer 104A is composed of BP-TEOS (borophospho-TEOS) oxide. The ILD layer 104 preferably has a planarized surface as shown.

Figure 2B:
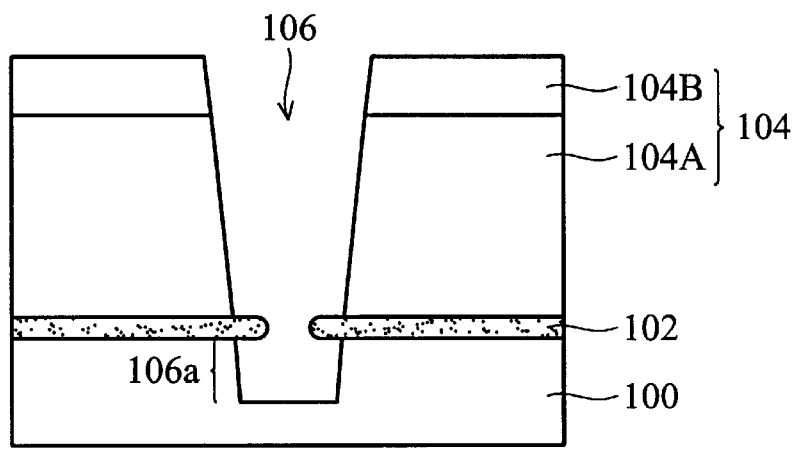

Then, as illustrated in FIG. 2B, a preliminary contact hole 106 is anisotropically etched through the ILD layer 104, the capping layer 102, and part of the way through the substrate 100 using a photoresist pattern as a mask. Here, the etching of the preliminary contact hole 106 is divided into three steps. First, the ILD layer 104 is dry etched preferably using a recipe comprising $CF_4$ until the surface of the capping layer 102 is exposed. Thereafter, the silicon nitride capping layer is dry etched using gases such as $Cl_2F_2$ or $CHF_3$ until the substrate surface is exposed. Finally, the underlying substrate 100 is also dry etched to a predetermined depth by using gases such as $Cl_2$, $BCl_3/CCl_4$, or $SiCl_4/Cl_2$ to form a recess portion 106a. The recess 106a is preferably less than 1,500 Å below the substrate surface.

Figure 2C:
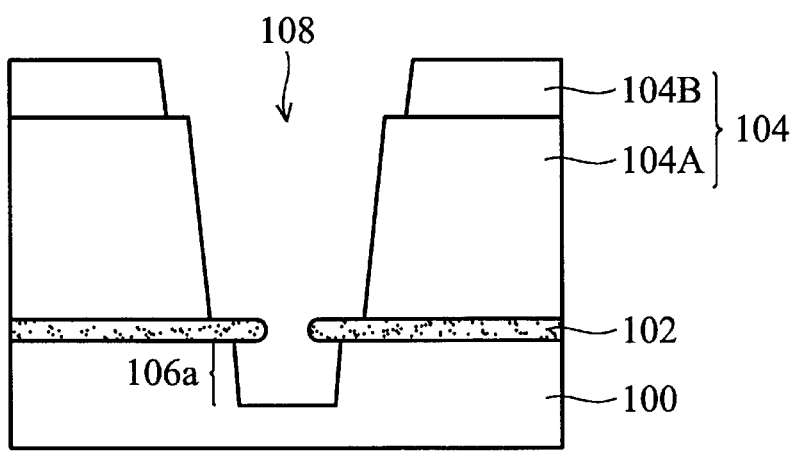

Next, the sidewalls of the preliminary contact hole 106 are isotropically etched in a wet etching process. A suitable etching agent is so chosen that the second dielectric layer 104B is etched more quickly than the first dielectric layer 104A. Thus, the sidewall in the second dielectric layer 104B is encroached to a larger extent than in the first dielectric layer 104A, and a desirable stepped profile is created. FIG. 2C illustrates a contact hole 108 having a stepped sidewall thus created. It is found that undoped oxide can be etched more quickly than doped oxide by a buffered HF solution (a mixed solution of $NH_4F$ and HF). Therefore, when the second dielectric layer 104B is undoped oxide and the first dielectric layer 104A is doped oxide, a buffered HF solution can be used for this etching, though it is commonly used for cleaning purposes.

Figure 2D:
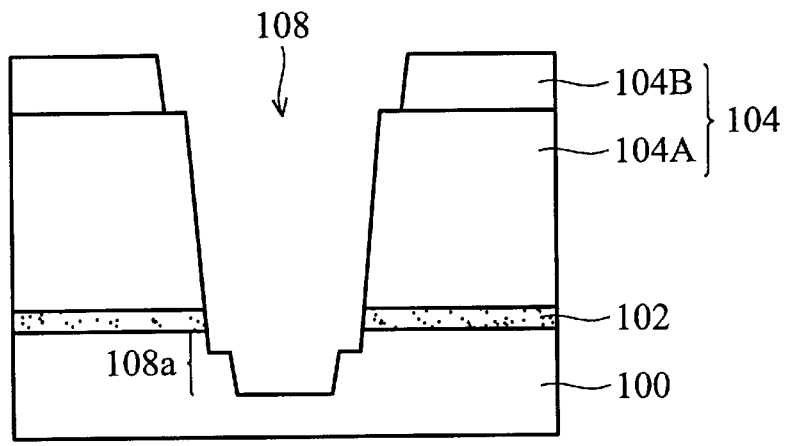

The above isotropic etching also exposes additional surface of the capping layer 102. As described previously, the overhang portion of the capping layer 102 is undesirable since it makes sputtering of the barrier metal layer more difficult and results in poor step coverage. Therefore, an anisotropic etching process is performed to remove the exposed portions of the capping layer 102 to complete the contact hole fabrication. As illustrated in FIG. 2D, this etching is preferably carried into the underlying substrate 100 so that a stepped trench 108a can be formed in the contact hole to provide even better step coverage.

Figure 2E:
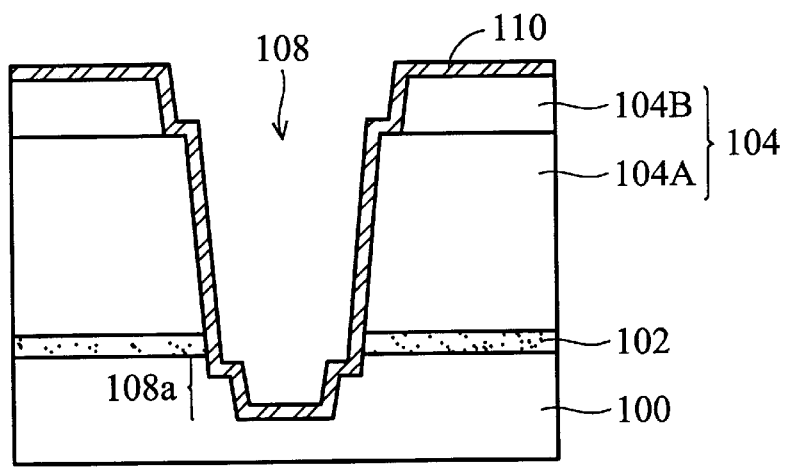
FIGS. 2E to 2F are cross-sections illustrating the steps for forming a barrier metal layer and a contact plug in the stepped contact hole of FIG. 2D.

Referring to FIG. 2E, after forming the contact hole 108, a barrier metal layer 110 such as a Ti/TiN layer or the like, can be deposited by sputtering with a good step coverage over the sidewalls and bottom of the contact hole 108. The barrier metal layer 110 is deposited to such a thickness as to not completely fill the contact hole 108.

Figure 2F:
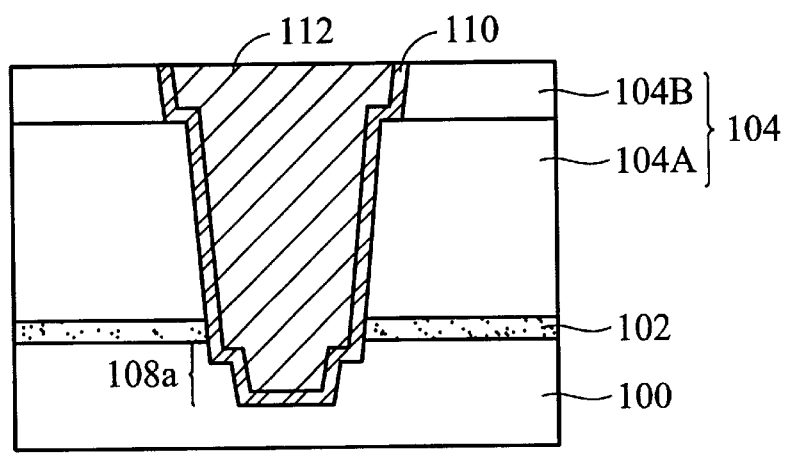

Thereafter, a conductive material is deposited to overfill the contact hole 108 by use of the CVD (Chemical Vapor Deposition) or PVD (Physical Vapor Deposition) method. Suitable conductive materials include W, Al, Cu, Al—Si—Cu alloy, and Al—Cu alloy. After this, the barrier metal layer 110 and conductive material outside of the contact hole 108 are removed by etch back or chemical mechanical polishing to form a conductive plug 112 in the contact hole 108, as shown in FIG. 2F.

Accordingly, the present invention provides a method for forming a stepped contact hole to improve step coverage. By using this method, high contact resistance and yield problems due to poor step coverage in the contact hole can be effectively avoided. A reliable contact for a semiconductor device is guaranteed.

While the invention has been particularly shown and described with reference to the preferred embodiment thereof, it will be understood by those skilled in the art that various changes in form and details may be made without departing from the spirit and scope of the invention.

What is claimed is:

1. A method for forming a stepped contact hole for a semiconductor device, the method comprising the steps of:
    forming a capping layer on a substrate;
    sequentially forming a first dielectric layer and a second dielectric layer having different etch rates on the capping layer;
    etching a preliminary contact hole through the second dielectric layer, the first dielectric layer, the capping layer, and part of the way through the substrate;
    isotropically etching the sidewalls of the preliminary contact hole with an etching agent having a higher etch rate for the second dielectric layer than for the first dielectric layer, thereby forming a contact hole having a stepped sidewall; and
    anisotropically etching to remove exposed portions of the capping layer.

2. The method as claimed in claim 1, wherein the capping layer is silicon nitride.

3. The method as claimed in claim 1, wherein the capping layer is silicon oxynitride.

4. The method as claimed in claim 1, wherein the first dielectric layer is doped oxide, and the second dielectric layer is undoped oxide.

5. The method as claimed in claim 1, wherein the first dielectric layer is BP-TEOS oxide (borophospho-tetraethylorthosilicate) and the second dielectric layer is TEOS oxide (tetraethylorthosilicate).

6. The method as claimed in claim 5, wherein the etching agent is a buffered HF solution.

7. The method as claimed in claim 1, wherein the contact hole has a recess less than 1,500 Å below the substrate surface.

8. A method for manufacturing a semiconductor device, comprising the steps of:
    forming a capping layer on a substrate;
    sequentially forming a first dielectric layer of BP-TEOS oxide and a second dielectric layer of TEOS oxide on the capping layer;
    etching a preliminary contact hole through the second dielectric layer, the first dielectric layer, the capping layer, and part of the way through the substrate;
    isotropically etching the sidewalls of the preliminary contact hole with a buffered HF solution having a higher etch rate for TEOS oxide than for BP-TEOS oxide, thereby forming a contact hole having a stepped sidewall;
    anisotropically etching to remove exposed portions of the capping layer;
    depositing a barrier metal layer on the stepped sidewall and bottom of the contact hole; and
    filling the contact hole with a conductive plug.

9. The method as claimed in claim 8, wherein the capping layer is silicon nitride.

10. The method as claimed in claim 8, wherein the capping layer is silicon oxynitride.

11. The method as claimed in claim 8, wherein the contact hole has a recess less than 1,500 Å below the substrate surface.

12. The method as claimed in claim 8, wherein the a barrier metal layer is a Ti/TiN layer.

* * * * *